(12) United States Patent
Chaffins et al.

(10) Patent No.: US 11,304,313 B2
(45) Date of Patent: Apr. 12, 2022

(54) THREE-DIMENSIONAL PRINTING (71) Applicant: HEWLETT-PACKARD DEVELOPMENT COMPANY, L.P., Spring, TX (US)

(72) Inventors: Sterling Chaffins, Corvallis, OR (US); Kevin P. Dekam, Corvallis, OR (US); Thomas A. Saksa, Corvallis, OR (US); Juan Sebastian Ramirez, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 33 days.

(21) Appl. No.: 16/491,186

(22) PCT Filed: Dec. 15, 2017

(86) PCT No.: PCT/US2017/066867
§ 371 (c)(1),
(2) Date: Sep. 5, 2019

(87) PCT Pub. No.: WO2019/117967
PCT Pub. Date: Jun. 20, 2019

(65) Prior Publication Data
US 2021/0282276 A1 Sep. 9, 2021

(51) Int. Cl.
*H05K 3/46* (2006.01)
*B29C 64/188* (2017.01)
(Continued)

(52) U.S. Cl.
CPC ......... *H05K 3/4664* (2013.01); *B29C 64/165* (2017.08); *B29C 64/188* (2017.08);
(Continued)

(58) Field of Classification Search
CPC .... B29C 64/165; B29C 64/188; H05K 1/036; H01K 3/4664; H01K 3/1241; H01K 3/125; B33Y 10/00; B33Y 70/00
See application file for complete search history.

(56) References Cited

U.S. PATENT DOCUMENTS 6,179,200 B1   1/2001   Kung et al.
6,388,203 B1   5/2002   Rinne et al.
(Continued)

FOREIGN PATENT DOCUMENTS

WO   WO2009130442-1   10/2009
WO   WO2015193045 A1  12/2015
WO   WO2017180162 A1  10/2017

OTHER PUBLICATIONS

Kang, S. K., et al., An Overview of Pb-Free, Flip-Chip Wafer-Bumping Technologies, Jun. 2008, DY. JOM.

*Primary Examiner* — Mary Lynn F Theisen
(74) *Attorney, Agent, or Firm* — HPI Patent Department (57) ABSTRACT

According to examples, a method of making a three-dimensional conductive printed part, including forming a layer of polymeric build material; selectively applying a fusing agent on a first selected area of the formed polymeric build material; selectively applying a conductive agent on a second selected area of the formed polymeric build material; and applying a solder receiving material to a portion of the first selected area and a portion of the second selected area; in which the solder receiving material is present on a surface of the conductive three-dimensional printed part is disclosed.

15 Claims, 4 Drawing Sheets

(51) Int. Cl.
   *B29C 64/165*   (2017.01)
   *H05K 1/03*     (2006.01)
   *H05K 3/12*     (2006.01)
   *B33Y 10/00*    (2015.01)
   *B33Y 70/00*    (2020.01)

(52) U.S. Cl.
   CPC ........... *H05K 1/036* (2013.01); *H05K 3/1241* (2013.01); *B33Y 10/00* (2014.12); *B33Y 70/00* (2014.12)

(56) References Cited

U.S. PATENT DOCUMENTS

| | | |
|---|---|---|
| 9,391,027 B2 | 7/2016 | Chauhan et al. |
| 9,508,667 B2 | 11/2016 | Prack |
| 9,777,380 B2 | 10/2017 | MacDonald et al. |
| 2007/0241482 A1 | 10/2007 | Giller et al. |
| 2015/0107881 A1 | 4/2015 | Mori et al. |
| 2016/0120040 A1 | 4/2016 | Elmieh et al. |

THREE-DIMENSIONAL PRINTING

BACKGROUND

In three-dimensional (3D) printing, an additive printing process is often used to make three-dimensional solid parts from a digital model. 3D printing is often used in rapid product prototyping, mold generation, mold master generation, and short-run manufacturing. Some 3D printing techniques are considered additive processes because they involve the application of successive layers of particulate material to an existing surface (template or previous layer). Additive processes often include solidification of the particulate material, which for some materials may be accomplished through use of heat and/or chemical binders.

BRIEF DESCRIPTION OF THE DRAWING

Features of the present disclosure are illustrated by way of example and not limited in the following figure(s), in which like numerals indicate like elements, in which.

DETAILED DESCRIPTION

For simplicity and illustrative purposes, the present disclosure is described by an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

Disclosed herein are a 3D printer, methods for implementing the 3D printer to form a 3D printed part, and a composition and an agent for use in the methods. A 3D part may be printed, formed, or otherwise generated on a build area platform. The 3D printer may also include a spreader to spread a layer of the composition onto the build area platform, and a printhead to selectively deposit the agent. The 3D printer may form successive layers of the composition, which may be spread, may receive the agent, and may be followed by application of energy. As used herein "3D printed part," "3D part," "3D object," "object," or "part" may be a completed 3D printed part or a layer of a 3D printed part.

Figure 3A:
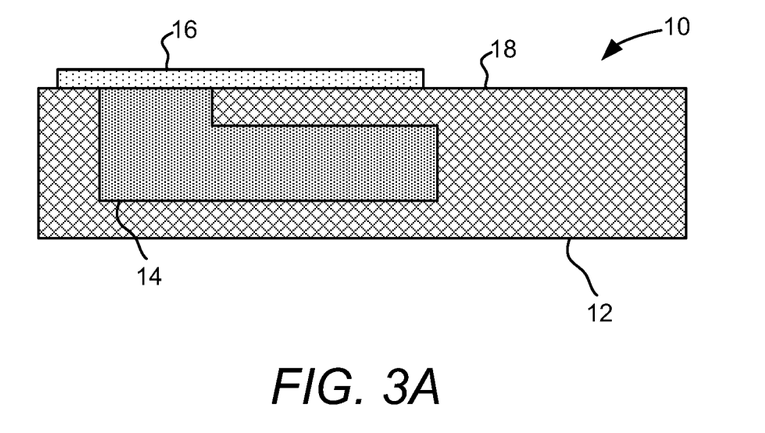
FIG. 3A shows a cross-sectional side view of an example conductive three-dimensional printed part.
Figure 3B:
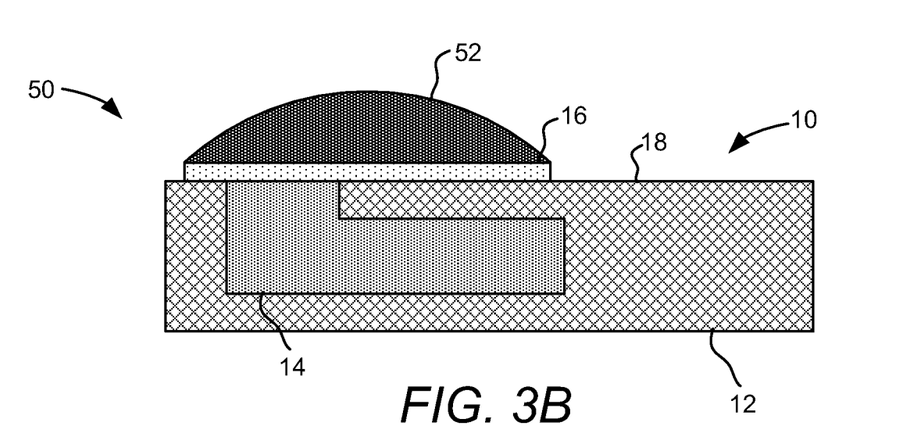
FIG. 3B shows a cross-sectional side view of an example electronic device including the example conductive 3D printed part depicted in FIG. 3A.

Reference is first made to FIGS. 3A and 3B. FIG. 3A shows a cross-sectional side view of an example conductive three-dimensional (3D) printed part 10 and FIG. 3B shows a cross-sectional side view of an example electronic device 50 including the example conductive 3D printed part 10 depicted in FIG. 3A. It should be understood that the conductive 3D printed part 10 depicted in FIG. 3A and the electronic device 50 depicted in FIG. 3B may include additional elements and that some of the elements described herein may be removed and/or modified without departing from the scopes of the conductive 3D printed part 10 or the electronic device 50 disclosed herein.

Figure 1:
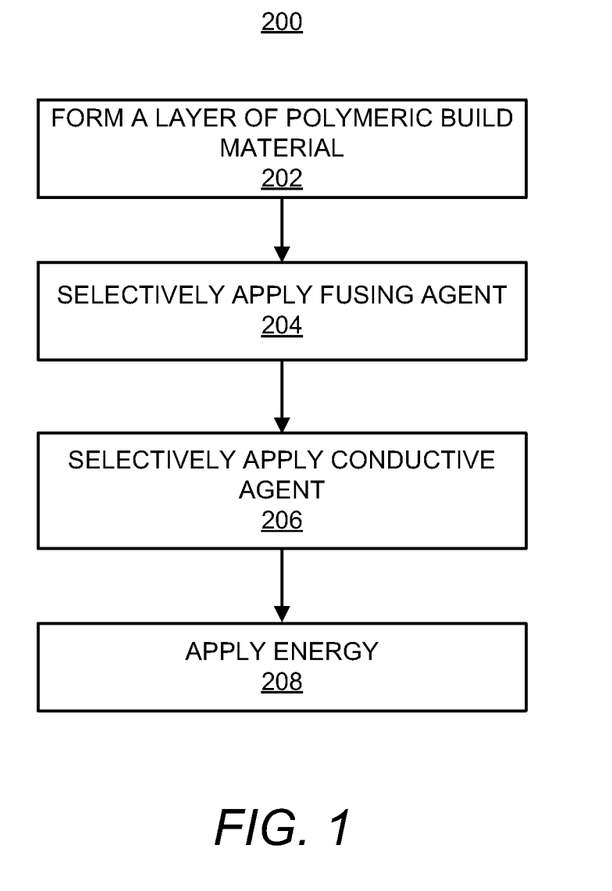
FIGS. 1 and 2, respectively, show flow diagrams of example methods of fabricating a 3D part.
Figure 2:
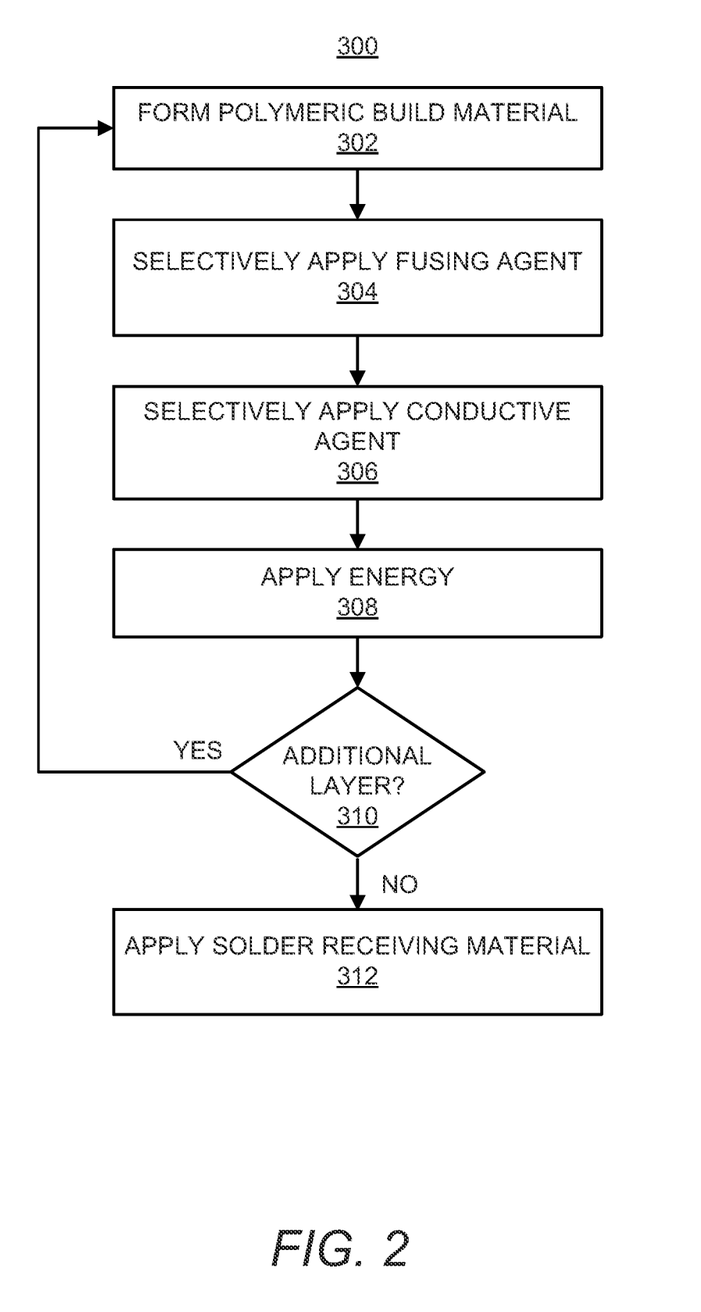

As shown in FIGS. 1 and 2, a method of making a three-dimensional conductive printed part may include forming a layer of polymeric build material; selectively applying a fusing agent on a first selected area of the formed polymeric build material; selectively applying a conductive agent on a second selected area of the formed polymeric build material; and applying a solder receiving material to a portion of the first selected area and a portion of the second selected area; in which the solder receiving material is present on a surface of the conductive three-dimensional printed part. As shown in FIGS. 3A and 3B, the conductive 3D printed part 10 may include a first selected area 12 including a fused polymeric composite of a polymeric build material fused with a fusing agent; a second selected area 14 including a conductive polymeric composite of the polymeric build material sintered with a conductive agent; and a solder receiving material 16 applied on a portion of the first selected area 12 and a portion of the second selected area 14, in which the solder receiving material is present on a surface of the conductive three-dimensional printed part. As shown in FIGS. 3A and 3B, the solder receiving material 16 may be present on a surface 18 of the conductive 3D printed part 10, in which the portions of the first selected area 12 and the second selected area 14 are exposed. According to examples, the first selected area 12 may be electrically non-conductive and the second selected area 14 may be electrically conductive.

As shown in FIG. 3B, in addition to the elements shown in the conductive 3D printed part 10 shown in FIG. 3A, the electronic device 50 may include an electrical component 52 applied on the solder receiving material 16. As discussed herein, through application of the solder receiving material 16 on exposed sections of the second selected area 14, the electrical component 52 may better bond and exhibit a lower contact resistance to the conductive 3D part 10.

Figure 4:
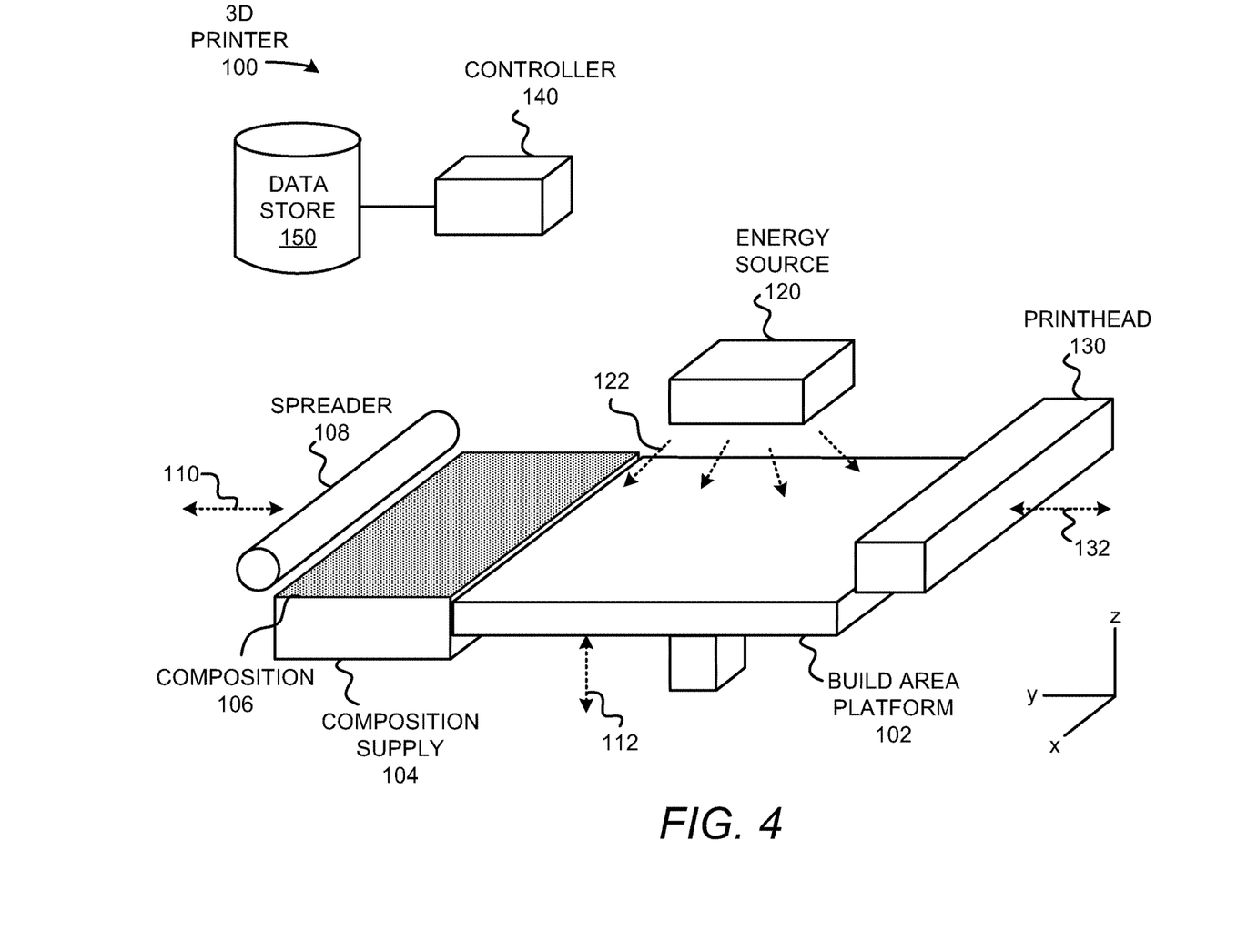
FIG. 4 shows an isometric view of an example three-dimensional (3D) printer for generating, building, or printing three-dimensional parts.

Turning now to FIG. 4, there is shown an isometric view of an example 3D printer 100 for generating, building, or printing three-dimensional parts. It should be understood that the 3D printer 100 depicted in FIG. 4 may include additional components and that some of the components described herein may be removed and/or modified without departing from a scope of the 3D printer 100 disclosed herein. It should also be understood that the components of the 3D printer 100 depicted in FIG. 4 may not be drawn to scale and thus, the 3D printer 100 may have a different size and/or configuration other than as shown therein.

The 3D printer 100 may be used to form aspects of the conductive 3D printed part 10. The 3D printer 100 is depicted as including a build area platform 102, a composition supply 104 containing a composition 106, and a spreader 108. The build area platform 102 may be integrated with the 3D printer 100 or may be a component that is separately insertable into the 3D printer 100, e.g., the build area platform 102 may be a module that is available separately from the 3D printer 100. The composition supply 104 may be a container or surface that is to position the composition 106 between the spreader 108 and the build area platform 102. The composition supply 104 may be a hopper or a surface upon which the composition 106 may be supplied. The spreader 108 may be moved in a direction as denoted by the arrow 110, e.g., along the y-axis, over the composition supply 104 and across the build area platform 102 to spread a layer of the composition 106 over a surface of the build area platform 102.

The composition 106 may include a build material. The build material may be a powder, a short fiber, a liquid, a paste, or a gel. In an aspect, the powder may be formed from, or may include short fibers, that may, for example, have been cut into short lengths from long strands, or threads of build material. The build material may be a polymeric material, metal material, or may be a composite material of polymer and ceramic. Non-limiting examples of build material include semi-crystalline thermoplastic materials with a wide processing window of greater than 5° C. (i.e., the temperature range between the melting point and the re-crystallization temperature). Some specific examples of the polymeric build material include polyamides (PAs) (e.g., PA 11/nylon 11, PA 12/nylon 12, PA 6/nylon 6, PA 8/nylon 8, PA 9/nylon 9, PA 66/nylon 66, PA 612/nylon 612, PA 812/nylon 812, PA 912/nylon 912, etc.). Other specific examples of the build material include polyethylene, polyether, polyether ketone, polyacrylate, polyethylene terephthalate (PET), and an amorphous variation of these materials. Still other examples of suitable build material include polystyrene, polyacetals, polypropylene, polycarbonate, polyester, thermoplastic polyurethanes, other engineering plastics, and blends of any two or more of the polymers listed herein.

Any of the previously listed build materials may be combined with ceramic particles to form the composite ceramic build material. Examples of suitable ceramic particles include metal oxides, inorganic glasses, carbides, nitrides, and borides. Some specific examples include alumina ($Al_2O_3$), glass, silicon mononitride (SiN), silicon dioxide ($SiO_2$), zirconia ($ZrO_2$), titanium dioxide ($TiO_2$), $Na_2O$/$CaO$/$SiO_2$ glass (soda-lime glass), silicon carbide (SiC), silicon nitride ($Si_3N_4$), yttrium oxide-stabilized zirconia (YTZ), or combinations thereof. The amount of ceramic particles that may be combined with the build material may depend on the build material used, the ceramic particles used, and the 3D part 10 to be formed. In an aspect, a conductive three-dimensional printed part for use in an electronic device may include non-conductive ceramic particles. In a further aspect, a conductive three-dimensional printed part for use in an electronic device may include conductive forms of ceramic particles in amounts that are small enough to render an overall effect of the ceramic particles as non-conductive.

The build material may have a melting point ranging from about 50° C. to about 400° C. As an example, the build material may be a polyamide having a melting point of 180° C., or thermoplastic polyurethanes having a melting point ranging from about 100° C. to about 165° C.

The build material may also include a binder, such as a polymer binder, a metal nanoparticle binder, or combinations thereof. The polymer binder may be a semi-crystalline polymer, such as polypropylene and polyethylene. The polymer binder may be a non-crystalline polymer, such as polyethylene oxide, polyethylene glycol (solid), acrylonitrile butadiene styrene, polystyrene, styrene-acrylonitrile resin, and polyphenyl ether. The polymer binder may be one of polypropylene, polyethylene, poly(methyl methacrylate), low density polyethylene, high density polyethylene, polyethylene oxide, polyethylene glycol, acrylonitrile butadiene styrene, polystyrene, styrene-acrylonitrile resin, polyphenyl ether, polyamide 11, polyamide 12, polymethyl pentene, polyoxymethylene, polyethylene terephthalate, polybutylene terephthalate, polyvinylidene fluoride, polytetrafluoroethylene, perfluoroalkoxy alkane, polyphenylene sulfide, polyurethanes, polyvinyl alcohol, polylactic acid, or polyether ether ketone.

The polymer binder may have a melting point temperature less than about 250° C., for example the melting point temperature may range from about 50° C. to about 249° C., for example from about 60° C. to about 240° C., and as a further example from about 70° C. to about 235° C.

It is to be understood that the build material may also include a charging agent, a flow aid, or combinations thereof. A charging agent may be added to suppress tribocharging. Examples of suitable charging agent(s) include, but are not limited to, aliphatic amines (which may be ethoxylated), aliphatic amides, quaternary ammonium salts (e.g., behentrimonium chloride or cocamidopropyl betaine), esters of phosphoric acid, polyethylene glycol esters, or polyols. Some suitable commercially available charging agents include a natural based ethoxylated alkylamine, a fatty acid ester, and an alkane sulfonate. In an example, the charging agent may be added in an amount ranging from greater than about 0 wt. % to less than about 5 wt. % based upon the total weight of the build material.

A flow aid may be added to improve the flowability of the build material by reducing the friction, the lateral drag, and the tribocharge buildup (by increasing the particle conductivity). Non-limiting examples of suitable flow aids include tricalcium phosphate, powdered cellulose, magnesium stearate, sodium bicarbonate, sodium ferrocyanide, potassium ferrocyanide, calcium ferrocyanide, bone phosphate, sodium silicate, silicon dioxide, calcium silicate, magnesium silicate, talcum powder, sodium aluminosilicate, potassium aluminum silicate, calcium aluminosilicate, bentonite, aluminum silicate, stearic acid, and polydimethylsiloxane. In an example, the flow aid may be added in an amount ranging from greater than about 0 wt. % to less than about 5 wt. % based upon the total weight of the build material.

The 3D printer 100 is further depicted as including a printhead 130 that may be scanned across the build area platform 102 in the direction indicated by the arrow 132, e.g., along the y-axis. The printhead 130 may be, for instance, a thermal inkjet printhead, a piezoelectric printhead, etc., and may extend a width of the build area platform 102. Although a single printhead 130 has been depicted in FIG. 4, it should be understood that multiple printheads may be used that span the width of the build area platform 102. Additionally, the printheads 130 may be positioned in multiple printbars. The printhead 130 may also deposit an agent, such as a fusing agent, and/or a conductive agent, over a selected area of a layer of the composition 106. In an aspect, multiple printheads 130 may independently deposit the same or different agent over a selected area of a layer of the composition 106. In an aspect, the multiple printheads 130 may simultaneously or sequentially deposit the same or different agents over a selected area of a layer of the composition 106. As an example, a first printhead may apply a fusing agent to a first selected area of the composition, such as the polymeric build material, to form a fused polymeric composite, which may form the first selected area 12 of the conductive 3D part 10. As another example, a second printhead may apply a conductive agent to a second selected area of the composition, such as the polymeric build material, to form a conductive polymeric composite, which may form the second selected area 14 of the conductive 3D part 10.

The agent, such as the fusing agent and/or the conductive agent, may be a composition including various components that may be selectively applied to the layer of the composition 106, such as the polymeric build material. Non-limiting examples of components of the agent include an aqueous vehicle, a non-aqueous vehicle, a chemical binder, a colorant, a solvent, a co-solvent, a surfactant, a dispersant, a biocide, an anti-kogation agent, viscosity modifiers, buffers, stabilizers, and combinations thereof. The presence of a co-solvent, a surfactant, and/or a dispersant in the agent may assist in obtaining a particular wetting behavior with the composition 106. A fusing agent may include similar or different components than the conductive agent. In an aspect, more than one agent, such as a fusing agent, and/or a conductive agent, may be used during the 3D printing process.

The agent may be a fusing agent. The fusing agent may be applied over the polymeric build material. Upon application of energy, such as electromagnetic radiation, the fusing agent may fuse with the polymeric build material to form a fused polymeric composite.

The fusing agent may include any of carbon black, lanthanum hexaboride ($LaB_6$), tungsten bronzes ($A_xWO3$), indium tin oxide ($In_2O3:SnO2$, ITO), aluminum zinc oxide (AZO), ruthenium oxide ($RuO_2$), silver (Ag), gold (Au), platinum (Pt), iron pyroxenes ($A_xFe_ySi2O6$ in which A is Ca or Mg, x=1.5-1.9, and y=0.1-0.5), modified iron phosphates ($A_xFe_yPO_4$), modified copper pyrophosphates ($A_xCu_yP2O_7$), a near-infrared absorbing dye, a near-infrared absorbing pigment, a molybdenum bronze, metal nanoparticles, a conjugated polymer, inorganic pigment, or combinations thereof. Tungsten bronzes may be alkali doped tungsten oxides. Examples of suitable alkali dopants (i.e., A in $A_xWO_3$) may be cesium, sodium, potassium, or rubidium. In an example, the alkali doped tungsten oxide may be doped in an amount ranging from greater than 0 mol % to about 0.33 mol % based on the total mol % of the alkali doped tungsten oxide. Suitable modified iron phosphates ($A_xFe_yPO_4$) may include copper iron phosphate (A=Cu, x=0.1-0.5, and y=0.5-0.9), magnesium iron phosphate (A=Mg, x=0.1-0.5, and y=0.5-0.9), and zinc iron phosphate (A=Zn, x=0.1-0.5, and y=0.5-0.9). For the modified iron phosphates, the number of phosphates may change based on the charge balance with the cations. Suitable modified copper pyrophosphates ($A_xCu_yP_2O_7$) include iron copper pyrophosphate (A=Fe, x=0-2, and y=0-2), magnesium copper pyrophosphate (A=Mg, x=0-2, and y=0-2), and zinc copper pyrophosphate (A=Zn, x=0-2, and y=0-2). Combinations of the inorganic pigments may also be used. Non-limiting examples of near-infrared absorbing dyes include aminium dyes, tetraaryldiamine dyes, cyanine dyes, pthalocyanine dyes, dithiolene dyes, and others. In an example, the fusing agent may be a near-infrared absorbing conjugated polymer such as poly(3,4-ethylenedioxythiophene)-poly(styrenesulfonate) (PEDOT SS), a polythiophene, poly(p-phenylene sulfide), a polyaniline, a poly(pyrrole), a poly(acetylene), poly(p-phenylene vinylene), polyparaphenylene, or combinations thereof. As used herein, "conjugated" refers to alternating double and single bonds between atoms in a molecule. A "conjugated polymer" refers to a polymer that has a backbone with alternating double and single bonds. The fusing agent may have a peak absorption wavelength in the range of 800 nm to 1400 nm.

The fusing agent may further include other suitable binders such as metal salts, sugars, sugar alcohols, polymeric or oligomeric sugars, low or moderate molecular weight polycarboxylic acids, polysulfonic acids, water soluble polymers containing carboxylic or sulfonic moieties, and polyether alkoxy silane. Some specific examples include glucose ($C_6H_{12}O_6$), sucrose ($C_{12}H_{22}O_{11}$), fructose ($C_6H_{12}O_6$), maltodextrines with a chain length ranging from 2 units to 20 units, sorbitol ($C_6H_{14}O_6$), erythritol ($C_4H_{10}O_4$), mannitol ($C_6H_{14}O_6$), or a short chain polyacrylic acid.

Other suitable binders that may be used include water-dispersible or water soluble polymers. Examples of polymer classes include acrylics, styrenics, polyethylenes, polypropylenes, polyesters, polyamides, polyurethanes, polyureas, polyethers, polycarbonates, polyacid anhydrides, and copolymers and/or combinations thereof. Such polymer particles may be iono-meric, film-forming, non-film-forming, fusible, or heavily crosslinked, and may have a wide range of molecular weights and glass transition temperatures.

The agent may be a conductive agent. The conductive agent may include a transition metal. When the conductive agent is applied onto a layer of the polymeric build material, the conductive agent may penetrate into the spaces between the polymeric build material. The layer may then be sintered by exposing the layer to energy, such as electromagnetic radiation. The conductive agent may facilitate sintering of the polymeric build material by absorbing energy from the electromagnetic radiation and converting the energy to heat. This may raise the temperature of the build material above the melting or softening point. Additionally, during printing, fusing, or both, the conductive agent may sinter to form a conductive polymer composite with the polymeric build material.

The transition metal in the conductive agent may be in a form of elemental transition metal particles. The elemental transition metal particles may include, for example, silver particles, copper particles, gold particles, platinum particles, palladium particles, chromium particles, nickel particles, zinc particles, or combinations thereof. The particles may also include alloys of transition metals, such as Au—Ag, Ag—Cu, Ag—Ni, Au—Cu, Au—Ni, AuAgCu, or AuAgPd. In an aspect, the conductive agent includes any of silver particles, copper particles, gold particles, platinum particles, palladium particles, chromium particles, nickel particles, zinc particles, Au—Ag alloy, Ag—Cu alloy, Ag—Ni alloy, Au—Cu alloy, Au—Ni alloy, Au—Ag—Cu alloy, Au—Ag—Pd alloy, or combinations thereof.

In an example, the elemental transition metal particles may be nanoparticles having an average particle size from about 10 nm to about 200 nm. In a further example, the elemental transition metal particles may have an average particle size from about 30 nm to about 70 nm.

In an aspect, other non-transition metals may be included in the conductive agent in addition to the transition metal. The non-transition metals may include lead, tin, bismuth, indium, gallium, and others.

As metal particles are reduced in size, the temperature at which the particles are capable of being sintered may also be reduced. Therefore, using elemental transition metal nanoparticles in the conductive agent may allow the particles to sinter and form a conductive polymeric composite at relatively low temperatures. The elemental transition metal particles in the conductive agent may be capable of being sintered at or below the temperature reached during fusing of the polymeric build material. The conductive agent may be capable of being sintered at a temperature from about 20° C. to about 350° C. The temperature at which the conductive agent may be capable of being sintered refers to the lowest temperature at which the particles will become sintered and then bind together with the polymeric build material, forming a conductive polymeric composite. It is understood that temperatures above this lowest temperature may also cause the conductive agent to become sintered.

The conductive agent may include elemental transition metal particles that are stabilized by a dispersing agent. The dispersing agent may include ligands that passivate the surface of the particles. Suitable ligands may include a moiety that binds to the transition metal. Examples of such moieties may include sulfonic acid, phosphonic add, carboxylic acid, dithiocarboxylic add, phosphonate, sulfonate, thiol, carboxylate, dithiocarboxylate, amine, and others. In some cases, the dispersing agent may contain an alkyl group having from about 3 to about 20 carbon atoms, with one of the above moieties at an end of the alkyl chain. In an example, the dispersing agent may be an alkylamine, alkylthiol, or combinations thereof. In further examples, the dispersing agent may be a polymeric dispersing agent, such as polyvinylpyrrolidone (PVP), polyvinylalcohol (PVA), polymethylvinylether, poly(acrylic add) (PAA), nonionic surfactants, polymeric chelating agents, and others. The dispersing agent may bind to a surface of the elemental transition metal particles of the conductive agent through chemical and/or physical attachment. Chemical bonding may include a covalent bond, hydrogen bond, coordination complex bond, ionic bond, or combinations thereof. Physical attachment may include attachment through van der Waal's forces, dipole-dipole interactions, or a combination thereof.

The conductive agent may include a transition metal in the form of a metal salt or metal oxide. Under certain conditions, a transition metal salt or metal oxide in the conductive agent may form elemental transition metal particles in situ after being printed onto the polymeric build material. The elemental transition metal particles thus formed may then be sintered together to form a conductive polymeric composite. In some examples, a reducing agent may be reacted with the metal salt or metal oxide to produce elemental metal particles. In one example, a reducing agent may be underprinted onto the polymeric build material before the conductive agent. In another example, a reducing agent may be overprinted over the conductive agent. In either case, the reducing agent may be reacted with the metal salt or metal oxide to form elemental metal particles before the polymeric build material is fused. Suitable reducing agents may include, for example, glucose, fructose, maltose, maltodextrin, trisodium citrate, ascorbic add, sodium borohydride, ethylene glycol, 1,5-pentanediol, 1,2-propylene glycol, and others.

The concentration of transition metal in the conductive agent may vary. However, higher transition metal concentrations may tend to provide better conductivity due to a larger amount of conductive material being deposited on the polymeric build material. In some examples, the conductive agent may contain from about 5 wt. % to about 50 wt. % of the transition metal, with respect to the entire weight of the conductive agent. In further examples, the conductive agent may contain from about 10 wt. % to about 30 wt. % of the transition metal, with respect to the entire weight of the conductive agent.

A pretreat composition may be used with the conductive agent. The pretreat composition may include a halogen salt, such as sodium chloride or potassium chloride, for example. The halogen salt may react with dispersing agents at the surfaces of transition metal particles to remove the dispersing agents from the particles. This may increase the sintering between the metal particles and improve the conductivity of the conductive polymeric composite. The pretreat composition may be applied onto the polymeric build material before the conductive agent. When the conductive agent is applied over the pretreat composition, the transition metal particles may come into contact with the halogen salt in the pretreat composition. In alternate examples, the polymeric build material may be pretreated with a halogen salt before being used in the 3-dimensional printing system. When the conductive agent is applied onto the polymeric build material, the transition metal particles in the conductive agent may come into contact with the halogen salt already present on the polymeric build material.

The colorant may be, for example, a pigment and/or dye. The colorant may have any color (e.g., cyan, magenta, yellow, white, etc.). Some examples of a colorant include a set of cyan, magenta, and yellow, such as C1893A (cyan), C1984A (magenta), and C1985A (yellow); or C4801A (cyan), C4802A (magenta), and C4803A (yellow); all of which are available from Hewlett-Packard Company. Other commercially available colorants include C9384A (printhead HP 72), C9383A (printhead HP 72), C4901A (printhead HP 940), and C4900A (printhead HP 940).

Some examples of a white colorant include pigments, such as titanium dioxide ($TiO_2$), zinc oxide (ZnO), calcium carbonate ($CaCO_3$), barium sulfate ($BaSO_4$), or combinations thereof. The colorant may, in some instances, be dispersed with a dispersing additive. As such, the dispersing additive helps to uniformly distribute the colorant throughout the colored printing liquid. The dispersing additive may be present in the agent in an amount ranging from about 0.01 wt % to about 0.8 wt. % based on the total weight of the colorant. Some examples of the dispersing additive include a water soluble acrylic acid polymer, a high molecular weight block copolymer with pigment affinic groups, and combinations thereof.

Surfactant(s) may be used to improve the wetting properties and the jettability of the agent. Examples of suitable surfactants may include a self-emulsifiable, nonionic wetting agent based on acetylenic diol chemistry, a nonionic fluorosurfactant, and combinations thereof. In other examples, the surfactant may be an ethoxylated low-foam wetting agent or an ethoxylated wetting agent and molecular defoamer. Still other suitable surfactants include non-ionic wetting agents and molecular defoamers or water-soluble, non-ionic surfactants. In some examples, it may be desirable to utilize a surfactant having a hydrophilic-lipophilic balance (HLB) less than 10. Whether a single surfactant is used or a combination of surfactants is used, the total amount of surfactant(s) in the agent may range from about 0.1 wt % to about 3 wt % based on the total weight of the agent.

Some examples of a co-solvent include 1-(2-hydroxyethyl)-2-pyrollidinone, 2-Pyrrolidinone, 1,5-Pentanediol, Triethylene glycol, Tetraethylene glycol, 2-methyl-1,3-propanediol, dipropylene glycol methyl ether, tripropylene glycol butyl ether, dipropylene glycol butyl ether, triethylene glycol butyl ether, 1,6-Hexanediol, Tripropylene glycol methyl ether, N-methylpyrrolidone, Ethoxylated Glycerol-1 (LEG-1), 1,2-hexanediol, and combinations thereof. The co-solvent may be present in an amount ranging from about 10 wt. % to about 30 wt. % based on the total weight of the agent.

Examples of suitable biocides include an aqueous solution of 1,2-benzisothiazolin-3-one, quaternary ammonium compounds, bicyclic oxazolidines, glutaraldehyde-based products, zinc dimethyldithiocarbamate, 20% aqueous dipropylene glycol solution of 1,2-benzisothiazolin-3-one, glycol based benzisothiazolone, and an aqueous solution of methylisothiazolin. Whether a single biocide is used or a combination of biocides is used, the total amount of biocide(s) in the fusing agent may range from about 0.1 wt % to about 1 wt % with respect to the total weight of the fusing agent.

Non-limiting examples of suitable anti-kogation agents include oleth-3-phosphate or polyoxyethylene (3) oleyl mono/di-phosphate, a metal chelator/chelating agent, such as methylglycinediacetic acid, and combinations thereof.

An example agent, such as a fusing agent, may include from about 1 wt. % to about 10 wt. % of colorant, from about 10 wt. % to about 30 wt. % of co-solvent(s), from about 0.5 wt. % to about 2 wt. % of dispersant(s), from 0.01 wt. % to about 1 wt. % of anti-kogation agent(s), from about 0.1 wt. % to about 5 wt. % of binder(s), from about 0.05 wt. % to about 0.1 wt. % biocide(s), and a balance of water. Another example may include from about 1 wt. % to about 7 wt. % of colorant, from about 10 wt % to about 30 wt. % of co-solvent(s), from about 0.25 wt. % to about 2 wt. % of dispersant(s), from 0.05 wt. % to about 0.1 wt. % of chelating agent(s), from about 0.005 wt. % to about 0.2 wt. % of buffer(s), from about 0.05 wt. % to about 0.1 wt. % biocide(s), and a balance of water.

Following selective deposition of the agent onto selected areas of the layer of the composition 106, energy 122 may be applied, such as by heat lamps, ultraviolet lights, and the like, to the selectively applied agent, such as the fusing agent and the conductive agent. The agents may absorb the energy to form their respective composite materials. The above-described process may be repeated until a predetermined number of layers have been formed to fabricate a desired 3D part.

Following the application of energy 122, the build area platform 102 may be lowered as denoted by the arrow 112, e.g., along the z-axis. In addition, the spreader 108 may be moved across the build area platform 102 to form a new layer of composition 106 on top of the previously formed layer. In an aspect, the spreader 108 may form a layer of polymeric build material. Moreover, the printhead 130 may apply the agent onto predetermined areas of the new layer of composition 106. For example, the first printhead 130 may apply a fusing agent on a first selected area of the polymeric build material and second printhead may apply a conductive agent on a second selected area of the polymeric build material. Energy 122 may be applied to form a fused polymeric composite in the first selected area and to form a conductive polymeric composite in the second selected area.

As also shown in FIG. 4, the 3D printer 100 may include a controller 140 that may control operations of the build area platform 102, the composition supply 104, the spreader 108, the energy source 120, and the printhead 130. The controller 140 is also depicted as being in communication with a data store 150. The data store 150 may include data pertaining to a 3D part to be printed by the 3D printer 100.

Various manners in which an example conductive 3D part 10 may be fabricated are discussed in greater detail with respect to the example methods 200 and 300 respectively depicted in FIGS. 3 and 4. It should be apparent to those of ordinary skill in the art that the methods 200 and 300 may represent generalized illustrations and that other operations may be added or existing operations may be removed, modified, or rearranged without departing from the scopes of the methods 200 and 300.

The descriptions of the methods 200 and 300 are made with reference to the 3D printer 100 illustrated in FIG. 4 for purposes of illustration. It should, however, be clearly understood that 3D printers and other types of apparatuses having other configurations may be implemented to perform either or both of the methods 200 and 300 without departing from the scopes of the methods 200 and 300.

Prior to execution of the method 200 or as part of the method 200, the 3D printer 100 may access data pertaining to a 3D part that is to be printed. By way of example, the controller 140 may access data stored in the data store 150 pertaining to a 3D part that is to be printed. The controller 140 may determine the number of layers of composition 106 that are to be formed and the locations at which an agent from the printhead 130 is to be selectively applied on areas of each of the respective layers of composition 106.

With reference first to FIG. 1, at block 202, a composition 106 may be formed over a build area platform 102. As discussed herein, the composition 106 may be formed of polymeric build material. In addition, at block 204, a fusing agent may be applied on a first selected area 12 of the formed layer of the polymeric build material to form a fused polymeric composite, upon application of energy. At block 206, a conductive agent may be applied on a second selected area 14 of the formed layer of the polymeric build material to form a conductive polymeric composite upon application of energy. In addition, in some examples, a plurality of agents, such as a detailing agent, an antistatic agent, or both, may be selectively applied onto the polymeric build material.

At block 208, energy 122 may be applied. The method 200 may represent a plurality of operations in which multiple layers of polymeric build material are successively formed, each selectively applied with an agent, such as a fusing agent, and/or a conductive agent, and supplied with energy to form the respective composite materials.

Turning now to FIG. 2, at block 302, the polymeric build material may be formed. At block 304, a fusing agent may be selectively applied onto the formed polymeric build material and at block 306, a conductive agent may be selectively applied onto the formed polymeric build material. Blocks 302, 304, and 306 may be similar to blocks 202, 204, and 206 discussed above with respect to FIG. 1. In addition, at block 308, energy 122 may be applied in manners similar to those discussed above with respect to block 208 to form the fused polymeric composite and the conductive polymeric composite. At block 310, a determination may be made, for instance, by the controller 140 of the 3D printer 100, as to whether an additional layer should be formed. In response to a determination that another layer is to be formed, blocks 302-308 may be repeated on top of a previously deposited layer.

However, in response to a determination that an additional layer is not to be formed, the formed layers, may be cooled and removed from the 3D printer 100. Extraneous composition, such as the polymeric build material, may be removed. By way of example, the three dimensional printed part may be placed in a media blasting cabinet and the extraneous composition may be sandblasted away. An air gun or brush may be used to remove extraneous composition. As another example, the extraneous composition may be removed through mechanical vibration and/or other removal techniques.

At block 312, a solder receiving material 16 may be applied to a portion of the first selected area 12 and a portion of the second selected area 14 on a surface 18 of the 3D printed part to form a conductive three-dimensional printed part 10, as shown in FIGS. 3A and 3B. The solder receiving material 16 may include conductive metals, compounds including conductive metals, and alloys of conductive metals, such as brass, and bronze. Non-limiting examples of conductive metals include lead, tin, bismuth, indium, zinc, gallium, silver, copper, gold, aluminum, nickel, iron, and platinum. In an aspect, the soldering receiving material 16 may be applied in locations that are to receive electrical components 52. The soldering receiving material 16 may be formulated to have low inciting temperatures useful for soldering, such as less than about 230° C.

The solder receiving material 16 may increase a conductive surface area of the surface of the conductive three-dimensional printed part 10. In an aspect, the presence of the solder receiving material 16 may raise a conductive material above a plane of the fused polymeric composite, which may increase the conductive surface area.

In addition, the solder receiving material 16 may provide a surface over a portion of the first selected area 12 and a portion of the second selected area 14. The surface of the solder receiving material 16 may also provide an electrical component 52, as shown in FIG. 3B, with a mechanically durable and usable point of contact.

The solder receiving material 16 may also facilitate soldering of an electrical component 52 to the conductive three-dimensional printed part 10. In an aspect, the solder receiving material 16 may increase a cross-section of conductive material, such as metal, versus fused polymeric composite on the surface of the conductive three-dimensional printed part 10.

The solder receiving material 16 may be applied on a portion of the first selected area 12 and a portion of the second selected area 14. Applying a solder receiving material may include a process selected from the group consisting of electrolysis, electroless plating, thin-film deposition, vapor deposition, or sputtering. Any other metal deposition process may be used. In an aspect, the process is an electroless plating process with a copper compound as the solder receiving material 16. The electroless plating process may occur at room temperature for a period of about 5 minutes to about 120 minutes, for example, for about 20 minutes to about 90 minutes, and as a further example, for about 40 minutes to about 60 minutes. In an aspect, the solder receiving material 16 may be present in a thickness to spread a current and reduce point contact resistance. As an example, the thickness of the solder receiving material 16 may be from about 0.0001 inches to about 6 mils, for example from about 0.0002 inches to about 4 mils, and as a further example about 1.4 mils of solder receiving material.

The solder receiving material 16 may be applied on the portion of the first selected area and the portion of the second selected area to form a pattern. Non-limiting examples of a pattern include any of a grid, stars, stripes, a spiderweb, circles, triangles, an array of shapes, or combinations thereof. In an aspect, a decorative material may be applied over the solder receiving material 16. In another aspect, the decorative material may be the solder receiving material 16. The decorative material may include a transparent material, such as an acrylic. In an aspect, the decorative material may include a a transparent material, gold, nickel, chrome, niobium, an iridescent metal, and combinations thereof.

An applied solder receiving material may deposit upon exposed inorganics or electrically conductive materials as well. In an example, the fused polymer composite may act like a solder mask when it is untreated by an etchant or other prep processes. An applied solder receiving material 16 may then selectively bind to the conductive polymeric composite, and can cover/mask that fraction of polymer in the composite that provides some degree of contact resistance. This modified surface may then be comprised of less resistive (polymeric) surface area, allowing the wetting of solder and/or lower contact resistance.

In an aspect, the method of making a conductive three-dimensional printed part 10 may include abrading or etching a portion of the fused polymeric composite and/or the conductive polymeric composite before application of the solder receiving material 16. Abrading and/or etching may assist with binding of the solder receiving material 16. Additionally, abrading and/or etching may increase the solder strength. Any process that alters a surface of the portion of the fused polymeric composite and/or the conductive polymeric composite may be used.

The conductive three-dimensional printed part 10 may be used as a component of an electronic device 50, as shown in FIG. 3B. In this regard, the electronic device 50 may include a solder receiving material 16 applied on a portion of a first selected area 12 including a fused polymeric composite of a polymeric build material and a fusing agent, and on a portion of a second selected area 14 including a conductive polymeric composite of the polymeric build material and a conductive agent; and an electronic component 52 applied on the solder receiving element 16. The electronic device 50 may have an increased mechanical strength at a point of contact between the solder receiving material 16 and the electrical component 52. Non-limiting examples of the electrical component 52 may include any of a wire, a switch, a contact, a sensor, a controller, a battery, a circuit, pins, sockets, jumpers, integrate circuit, transistor, capacitor, resistor, display, indicator device, or combinations thereof.

Example

A three-dimensional printed part was made using a 3D printer with a polymeric build material, a fusing agent, and a conductive agent, in which the conductive agent included silver particles. The three-dimensional printed part was placed into an electroless plating bath at room temperature for about 40 to about 60 minutes. The electroless plating bath included two compositions that were combined in a 1:1 ratio. The first composition is in Table 1 and the second composition is in Table 2. A commercially available electroless copper kit from Caswell, Inc., in Lyons, N.Y.

TABLE 1

| Components | Formulation wt % |
| --- | --- |
| triethanolamine | 5-10% |
| ethylenediaminetetraacetic acid tetrasodium salt | 1-5% |
| diethanolamine | 1-5% |
| copper sulfate pentahydrate | 1-5% |
| aqueous sodium hydroxide | balance |

TABLE 2

| Components | Formulation wt % |
| --- | --- |
| methanol | 25% |
| formaldehyde | 4% |
| water | 71% |

After removal from the electroless plating bath, a conductive three-dimensional printed part 10 was formed.

A three-dimensional printed part was made and subjected to electroless plating with a solder receiving material, such as the copper sulfate pentahydrate. The solder receiving material was applied to a portion of the conductive three-dimensional printed part including a first selected area of fused polymeric composite and a portion of the second selected area including a conductive polymeric composite to create a conductive three-dimensional printed part. The solder receiving material provides a mechanical strong point of contact for an electrical component. Additionally, the solder receiving material can provide a decorative element to the conductive three-dimensional printed part, for example, if applied in a decorative pattern. This conductive three-dimensional printed part can be further modified to include an electrical component on the solder receiving material to form an electronic device.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example of the disclosure along with some of its variations. The terms, descriptions and figures used herein are set forth by way of illustration and are not meant as limitations. Many variations are possible within the spirit and scope of the disclosure, which is intended to be defined by the following claims—and their equivalents—in which all terms are meant in their broadest reasonable sense unless otherwise indicated.

What is claimed is:

1. A method of making a three-dimensional conductive printed part, comprising:
   forming a layer of polymeric build material;
   selectively applying a fusing agent on a first selected area of the formed polymeric build material;
   selectively applying a conductive agent on a second selected area of the formed polymeric build material; and
   applying a solder receiving material to a portion of the first selected area and a portion of the second selected area;
   wherein the solder receiving material is present on a surface of the conductive three-dimensional printed part.

2. The method of claim 1, wherein applying a solder receiving material includes a process selected from the group consisting of electrolysis, electroless, thin-film deposition, vapor deposition, thin-film deposition, and sputtering.

3. The method of claim 2, wherein the process is an electroless plating process with a copper compound as the solder receiving material.

4. The method of claim 3, wherein the electroless plating process occurs at room temperature for a period of about 5 minutes to about 120 minutes.

5. A conductive three-dimensional printed part comprising:
   a first selected area including a fused polymeric composite of a polymeric build material fused with a fusing agent;
   a second selected area including a conductive polymeric composite of the polymeric build material sintered with a conductive agent; and
   a solder receiving material applied on a portion of the first selected area and a portion of the second selected area;
   wherein the solder receiving material is present on a surface of the conductive three-dimensional printed part.

6. The conductive three-dimensional printed part of claim 5, wherein the fusing agent includes any of carbon black, lanthanum hexaboride, tungsten bronzes, indium tin oxide, aluminum zinc oxide, ruthenium oxide, silver, gold, platinum, iron pyroxenes, modified iron phosphates, modified copper pyrophosphates, a near-infrared absorbing dye, a near-infrared absorbing pigment, a molybdenum bronze, metal nanoparticles, a conjugated polymer, inorganic pigment, or combinations thereof.

7. The conductive three-dimensional printed part of claim 5, wherein the conductive agent includes any of silver particles, copper particles, gold particles, platinum particles, palladium particles, chromium particles, nickel particles, zinc particles, Au—Ag alloy, Ag—Cu alloy, Ag—Ni alloy, Au—Cu alloy, Au—Ni alloy, Au—Ag—Cu alloy, Au—Ag—Pd alloy, or combinations thereof.

8. The conductive three-dimensional printed part of claim 5, wherein the solder receiving material includes any of conductive metals, compounds including conductive metals, or alloys of conductive metals.

9. The conductive three-dimensional printed part of claim 5, wherein the solder receiving material increases a conductive surface area of the surface of the conductive three-dimensional printed part.

10. The conductive three-dimensional printed part of claim 5, wherein the solder receiving material is applied on the portion of the first selected area and the portion of the second selected area to form a pattern.

11. The conductive three-dimensional printed part of claim 10, further comprising a decorative material applied over the solder receiving material.

12. The conductive three-dimensional printed part of claim 11, wherein the decorative material includes a transparent material, gold, nickel, chrome, niobium, an iridescent metal, and combinations thereof.

13. The conductive three-dimensional printed part of claim 5, wherein the solder receiving material is present in a thickness to spread a current and reduce point contact resistance.

14. An electronic device, comprising:
   a solder receiving material applied on a portion of a first selected area including a fused polymeric composite of a polymeric build material and a fusing agent, and on a portion of a second selected area including a conductive polymeric composite of the polymeric build material and a conductive agent; and
   an electrical component applied on the solder receiving material.

15. The electronic device of claim 14, wherein the electronic device has increased mechanical strength at a point of contact between the solder receiving material and the electrical component.

* * * * *